United States Patent [19]
Yu

[11] Patent Number: 6,043,131
[45] Date of Patent: Mar. 28, 2000

[54] METHOD FOR MAKING A FLOWER SHAPED DRAM CAPACITOR

[75] Inventor: Tzu-Chiang Yu, Hsinchu, Taiwan

[73] Assignee: Worldwide Semiconductor Manufacturing Corporation, Hsinchu, Taiwan

[21] Appl. No.: 09/041,827

[22] Filed: Mar. 12, 1998

[51] Int. Cl.$^7$ .................... H01L 21/8222; H01L 21/20; H01L 21/8242
[52] U.S. Cl. ................ 438/396; 438/329; 438/396; 438/393; 438/253; 438/239
[58] Field of Search .................................. 438/396, 329, 438/393, 253, 239

[56] References Cited

U.S. PATENT DOCUMENTS

| | | | |
|---|---|---|---|
| 5,478,768 | 12/1995 | Iwasa | 437/52 |
| 5,780,338 | 7/1998 | Jeng et al. | 438/253 |
| 5,854,106 | 12/1998 | Wu | 438/253 |

*Primary Examiner*—Carl Whitehead, Jr.
*Assistant Examiner*—James Park
*Attorney, Agent, or Firm*—Blakely Sokoloff Taylor and Zafman

[57] ABSTRACT

A method of forming a flower shaped capacitor for a DRAM over a bitline is disclosed. The method comprises the steps of: forming a first polysilicon layer over said bitline; forming a TEOS layer over said first polysilicon layer, patterning and etching an opening through said TEOS layer; depositing a second polysilicon layer; etching back said second polysilicon layer and the first polysilicon layer to form sidewall spacers in said opening; using the first polysilicon layer and sidewall spacers as a mask, etching through to said bitline and thereby removing said TEOS layer; depositing a third polysilicon layer; patterning and etching the third polysilicon layer to form a bottom storage node of the capacitor; and forming a dielectric layer and a top conductive layer over the bottom storage node.

12 Claims, 4 Drawing Sheets

METHOD FOR MAKING A FLOWER SHAPED DRAM CAPACITOR

TECHINICAL FIELD OF THE INVENTION

This invention relates to semiconductor memories, and more particularly, to an improved method for making a DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method of forming a flower shaped capacitor for a DRAM over a bitline is disclosed. The method comprises the steps of: forming a first polysilicon layer over said bitline; forming a TEOS layer over said first polysilicon layer, patterning and etching an opening through said TEOS layer; depositing a second polysilicon layer; etching back said second polysilicon layer and the first polysilicon layer to form sidewall spacers in said opening; using the first polysilicon layer and said sidewall spacers as a mask, etching through to said bitline and thereby removing said TEOS layer; depositing a third polysilicon layer; patterning and etching the third polysilicon layer to form a bottom storage node of the capacitor; and forming a dielectric layer and a top conductive layer over the bottom storage node.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM having a stacked capacitor. Moreover, the capacitor of the present invention is commonly used in DRAM cells as the capacitor over bitline (COB).

Figure 1:
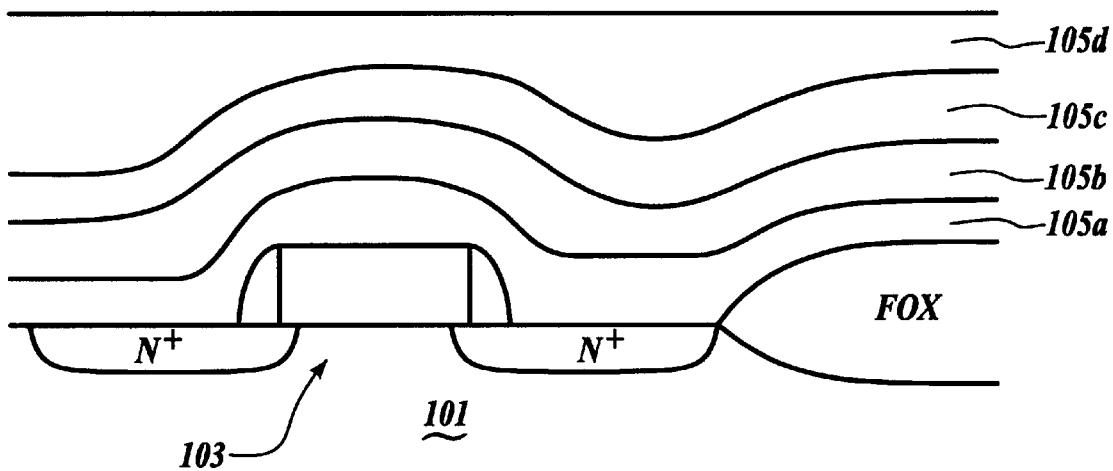
FIGS. 1–7 are cross-sectional views of a semiconductor substrate illustrating the steps of the present invention for forming a capacitor.

Turning to FIG. 1, using conventional techniques a semiconductor substrate 101 having formed thereon an access transistor 103 is shown. Formed atop the access transistor 103 are multiple dielectric layers 105a–d. The dielectric layers 105a–d are typically silicon dioxide, tetraethylorthosilicate (TEOS), or BPSG layers and are used for insulation and planarization purposes. The structure shown in FIG. 1 is well known in the art and will not be described in further detail herein.

Figure 2:
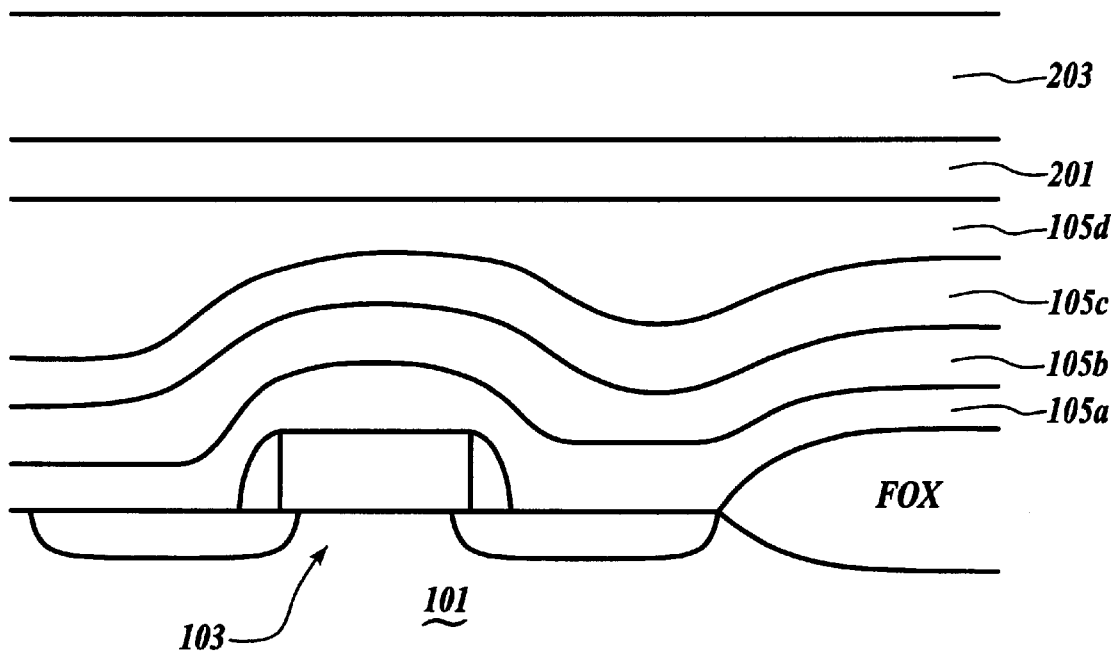

Turning next to FIG. 2, in accordance with the present invention, a first layer of in-situ doped polysilicon 201 is deposited using conventional CVD techniques to a thickness of 1000–2000 angstroms. Next, a layer of tetraethylorthosilicate (TEOS) 203 is formed using conventional methods atop the first polysilicon layer 201. As will be seen in greater detail below, the thickness of the TEOS layer 203 will determine the amount of increased capacitance for the DRAM capacitor. Generally, the thicker the TEOS layer 203, the greater the increase in the capacitance. In the preferred embodiment, the TEOS layer 203 is on the order of 3000–5000 angstroms thick.

Figure 3:
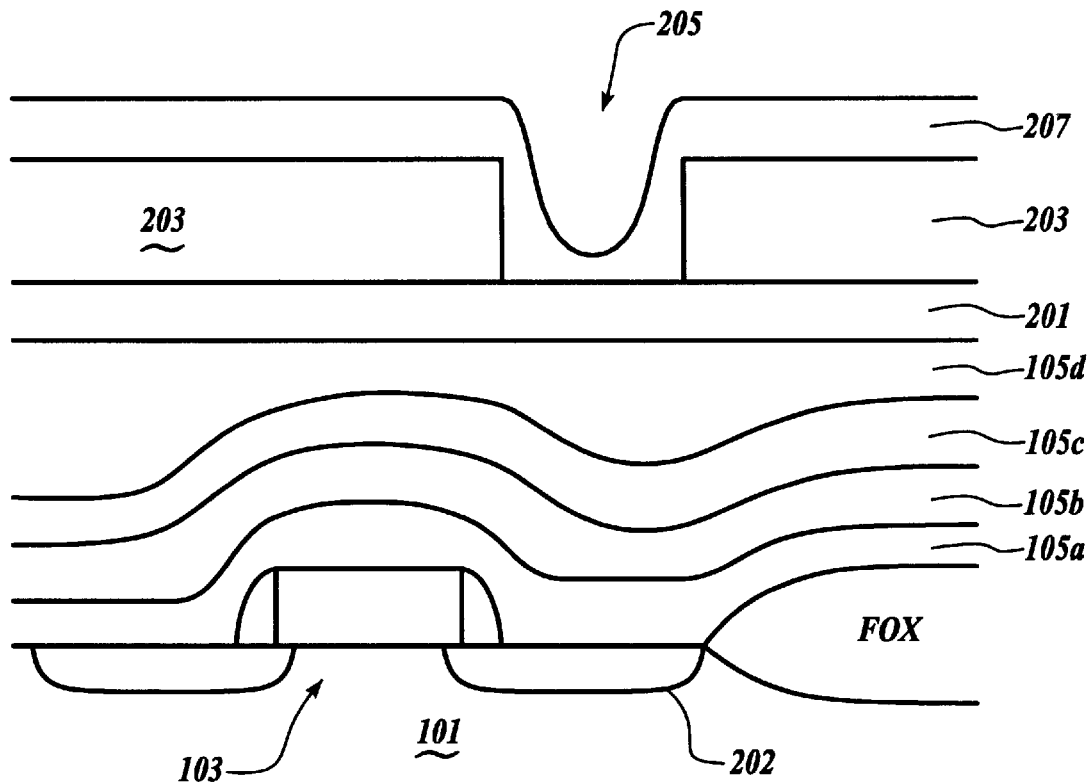

Next, turning to FIG. 3, the TEOS layer 203 is patterned and etched to form an opening 205 in the TEOS layer 203 down to the first polysilicon layer 201. The opening 205 is preferably centered atop the drain 202 of the access transistor 103. However, note that the opening 205 is wider than the spacing between the gate of the access transistor and the FOX region. As will be seen below, sidewall spacers will be formed that will narrow the opening 205 to fit onto the drain 202 of the access transistor.

Still referring to FIG. 3, a second in-situ doped polysilicon layer 207 is conformally deposited using conventional CVD methods over the opening 205 and the TEOS layer 203. The thickness of the second polysilicon layer 207 is preferably on the order 1500–2000 angstroms.

Figure 4:
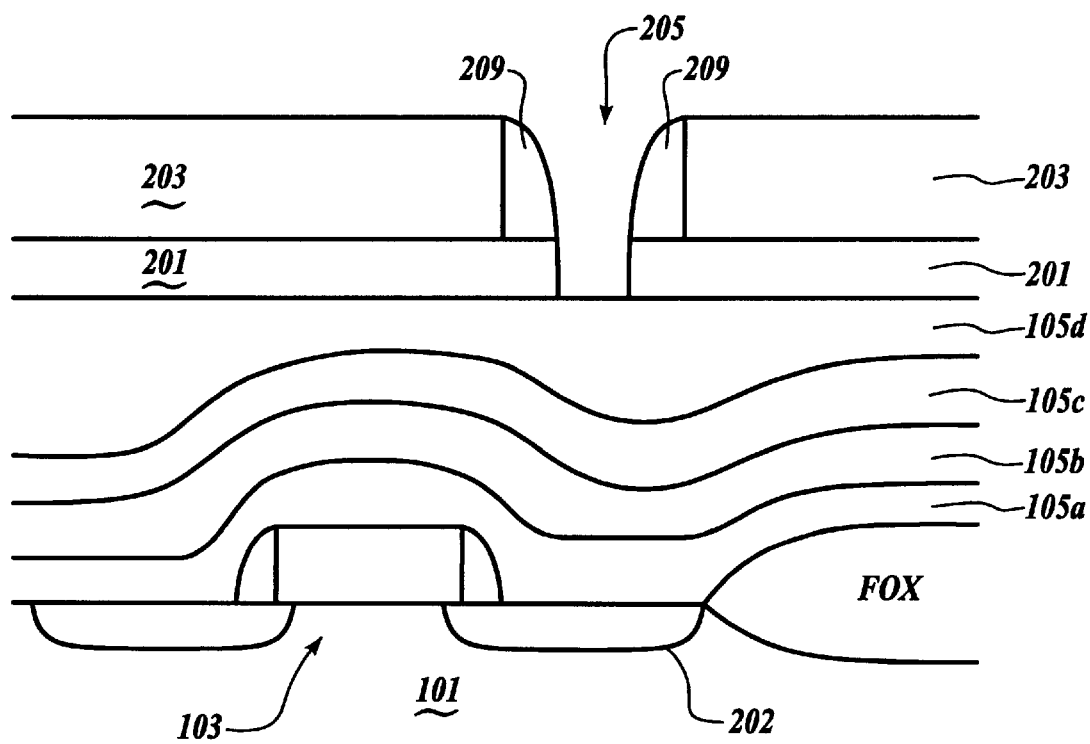

Next, turning to FIG. 4, the second polysilicon layer 207 is etched back using a conventional polysilicon anisotropic dry etching technique to form the sidewall spacers 209. The dry etching may use HBr/Cl$_2$ as the etching plasma. The TEOS layer 203 acts as an etching stop for the region outside of the opening 205, while within the opening 205, the first polysilicon layer 201 is removed and the underlying dielectric layer 105d is used as an etching stop.

Figure 5:
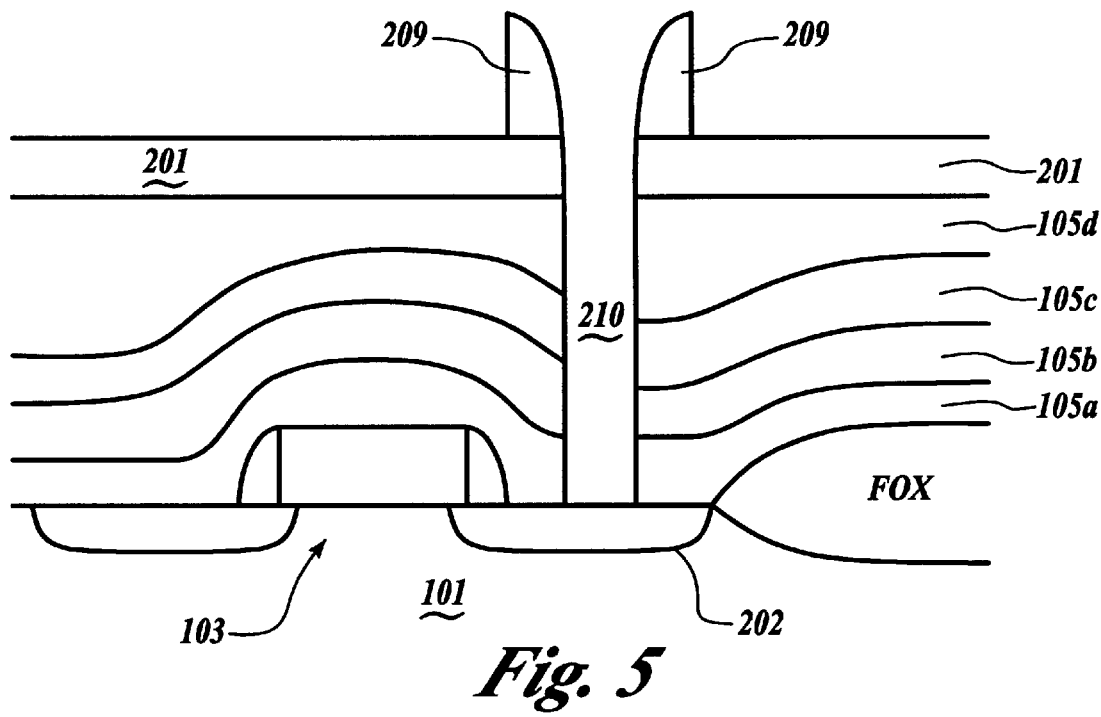

As seen in FIG. 5, a second oxide dry etching step is performed using, for example, CF$_4$/CHF$_3$ plasma. This oxide etching step will remove the TEOS layer 203. Additionally, using the first polysilicon layer 201 and the sidewall spacers 209 as a mask, the oxide etching step will also remove the dielectric layers 105a–d through to the drain 202 of the access transistor 103, thus forming a via 210.

Figure 6:
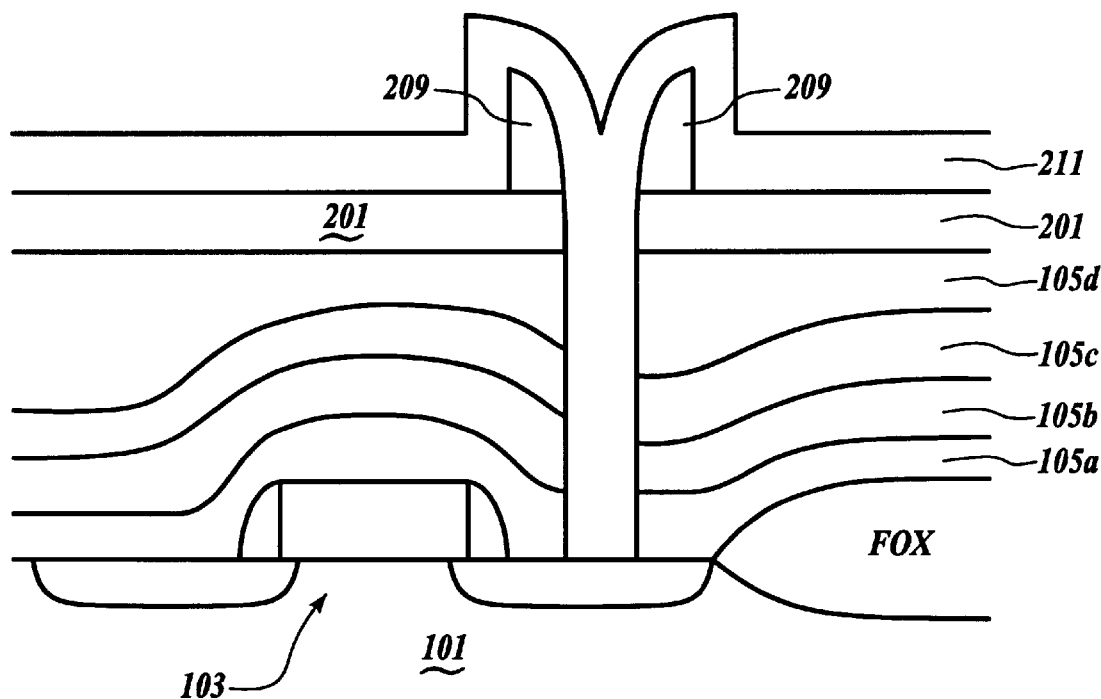

Next, as seen in FIG. 6, third in-situ doped polysilicon layer 211 is deposited into the via 210 and over the first polysilicon layer 201 and the sidewall spacers 209. Preferably, the third polysilicon layer 211 has a thickness of approximately 2500–4000 angstroms. Further, preferably, after the formation of the third polysilicon layer 211, a dilute HF solvent dip is performed to remove the native oxide over the via area and the surface of the polysilicon.

Figure 7:
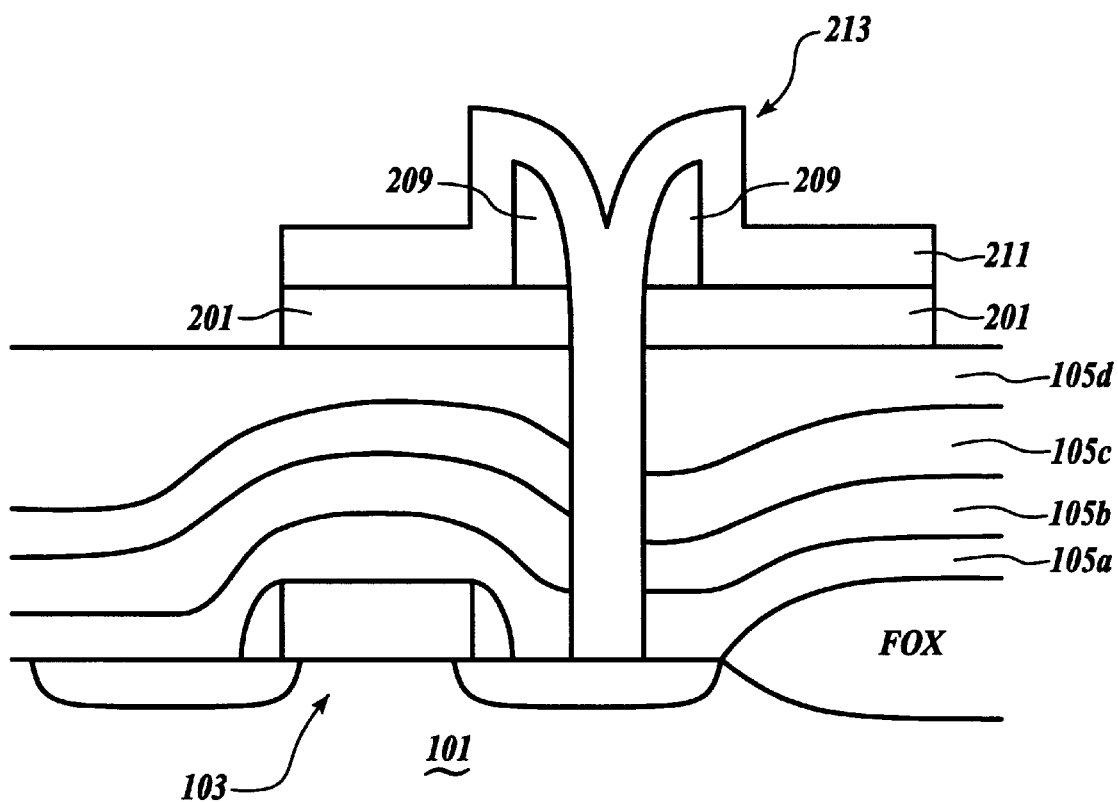

Turning to FIG. 7, the first polysilicon layer 201 and the third polysilicon layer 211 are then patterned and etched to from the bottom storage node 213 of the capacitor over bitline (COB). Finally, using conventional techniques, a dielectric (such as ONO) is deposited over the bottom storage node 213 and a final layer of polysilicon is deposited to complete the COB.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a capacitor for a DRAM over a bitline, the method comprising the steps of:

forming a first polysilicon layer over said bitline;

forming a TEOS layer over said first polysilicon layer, patterning and etching an opening through said TEOS layer;

depositing a second polysilicon layer;

etching back said second polysilicon layer and the first polysilicon layer to form sidewall spacers in said opening;

using the first polysilicon layer and said sidewall spacers as a mask, etching through to said bitline to form a via and thereby also removing said TEOS layer;

depositing a third polysilicon layer;

patterning and etching the third polysilicon layer to form a bottom storage node of the capacitor; and forming a dielectric layer and a top conductive layer over the bottom storage node.

2. The method of claim 1 wherein said dielectric layer is ONO.

3. The method of claim 1 wherein said first, second, and third polysilicon layers are in-situ doped polysilicon.

4. The method of claim 1 wherein said TEOS layer has a thickness of between 3000–5000 angstroms.

5. The method of claim 1 wherein said opening is wider than said via.

6. The method of claim 4 wherein said second polysilicon layer has a thickness in the range of 1500–2000 angstroms.

7. A method of making a flower shaped capacitor over a contact, said contact underneath a first oxide layer, the method comprising the steps of:

forming a first polysilicon layer over said contact;

forming a second oxide layer over said first polysilicon layer, patterning and etching an opening through said second oxide layer;

depositing a second polysilicon layer;

etching back said second polysilicon layer and the first polysilicon layer to form sidewall spacers in said opening;

using the first polysilicon layer and said sidewall spacers as a mask, etching through to said contact to form a via and thereby also removing said second oxide layer;

depositing a third polysilicon layer;

patterning and etching the third polysilicon layer to form a bottom storage node of the capacitor; and forming a dielectric layer and a top conductive layer over the bottom storage node.

8. The method of claim 7 wherein said second oxide layer is TEOS.

9. The method of claim 7 wherein said second oxide layer has a thickness of between 3000–5000 angstroms.

10. The method of claim 8 wherein said TEOS layer has a thickness of between 3000–5000 angstroms.

11. The method of claim 7 wherein said opening is wider than said via.

12. The method of claim 7 wherein said second polysilicon layer has a thickness in the range of 1500–2000 angstroms.

* * * * *